(12) United States Patent  
Lin

(10) Patent No.: US 7,400,179 B2
(45) Date of Patent: Jul. 15, 2008

(54) DIGITAL POWER-ON RESET

(75) Inventor: David H. Lin, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 150 days.

(21) Appl. No.: 11/511,783

(22) Filed: Aug. 29, 2006

(65) Prior Publication Data

US 2008/0122512 A1  May 29, 2008

(51) Int. Cl.
*H03K 3/00* (2006.01)
(52) U.S. Cl. .......................... 327/143; 327/198
(58) Field of Classification Search ............. 327/143, 327/144, 198
See application file for complete search history.

(56) References Cited

U.S. PATENT DOCUMENTS

| | | | |
|---|---|---|---|
| 5,105,376 A | 4/1992 | Pedron | 364/717 |
| 5,867,409 A | 2/1999 | Nozuyama | 364/717.03 |
| 6,014,446 A | 1/2000 | Finkelstein | 380/46 |
| 6,278,302 B1 | 8/2001 | El-Kik | 327/143 |
| 6,329,851 B1 | 12/2001 | Murphy | 327/143 |
| 6,556,057 B2 | 4/2003 | McClure | 327/143 |
| 6,650,155 B1 | 11/2003 | Nguyen et al. | 327/143 |
| 2005/0253638 A1* | 11/2005 | Dietrich et al. | 327/198 |

* cited by examiner

*Primary Examiner*—Kenneth B. Wells
*Assistant Examiner*—Daniel Rojas
(74) *Attorney, Agent, or Firm*—Christopher P. Maiorana P.C

(57) ABSTRACT

An apparatus comprising a plurality of flip-flops and a compare circuit. The flip-flops may each be configured to (i) receive a clock signal and an input signal and (ii) generate an output signal. The flip-flops may be configured in series such that the output signal of a first of the flip-flops is presented as the input signal to a second of the flip-flops. The compare circuit may be configured to generate a reset signal in response to each of the output signals. The reset signal is generated until each of the output signals matches a set of predetermined values stored in the compare circuit.

16 Claims, 5 Drawing Sheets

(12) United States Patent

DIGITAL POWER-ON RESET

FIELD OF THE INVENTION

The present invention relates to a power-on reset circuit generally and, more particularly, to a method and/or apparatus for implementing a digital power-on reset.

BACKGROUND OF THE INVENTION

When power is first applied to a chip (or integrated circuit) a reset signal is often asserted to put the chip into a known state to allow proper operation. In conventional systems, a Power-On-Reset (POR) circuit applies a reset signal for a specified amount of time after power has been applied. The reset signal is held long enough to extend longer than the time for the chip to completely receive power.

Conventional approaches often use an analog circuit to assert the reset signal after the power achieves a certain voltage threshold level. The reset signal is held for a specified amount of time. The POR circuit can be implemented externally to the chip with the reset signal being supplied as an input to the chip. In some cases, the POR circuit can be implemented as an analog component on the integrated circuit.

It would be desirable to implement a power-on reset circuit using only digital circuitry.

SUMMARY OF THE INVENTION

The present invention concerns an apparatus comprising a plurality of flip-flops and a compare circuit. The flip-flops may each be configured to (i) receive a clock signal and an input signal and (ii) generate an output signal. The flip-flops may be configured in series such that the output signal of a first of the flip-flops is presented as the input signal to a second of the flip-flops. The compare circuit may be configured to generate a reset signal in response to each of the output signals. The reset signal is generated until each of the output signals matches a set of predetermined values stored in the compare circuit.

The objects, features and advantages of the present invention include implementing a power-on reset circuit that may (i) be implemented using all digital components, (ii) implement the reset starting from the beginning of a circuit power up, (iii) adjust a pulse width of the reset signal (iv) minimize the pulse width of the reset signal by adapting to a characteristic of a stable system, (v) provide a simplified chip design by only using digital logic (instead of analog components), (vi) be implemented inexpensively by using only a very small amount of silicon area, (vii) use only a small amount of power, and/or (viii) provide low-leakage cells that may be used to minimize power consumption.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
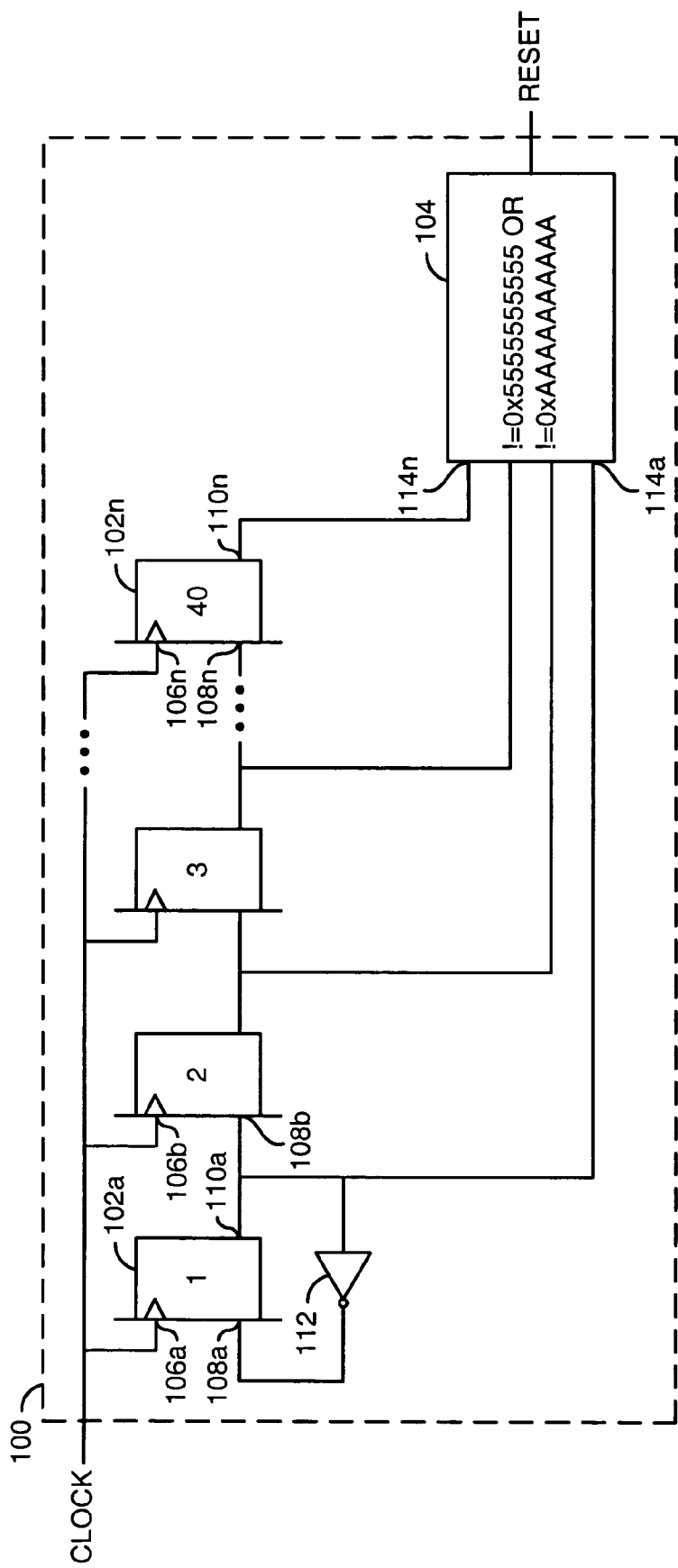
FIG. 1 is a block diagram of a preferred embodiment of the present invention.

Referring to FIG. 1, a block diagram of a circuit 100 is shown in accordance with a preferred embodiment of the present invention. The circuit 100 may be implemented as a Power-On-Reset circuit. The circuit 100 may be implemented using digital components. The circuit 100 generally comprises a plurality of flip-flops 102a-102n and a compare circuit 104. In the example shown, the particular number of flip-flops 102a-102n may be implemented as 40 (e.g., the label on the flip-flop 102n shows 40 flip-flops). However, the particular number of flip-flops 102a-102n may be varied to meet the design criteria of a particular implementation. The flip-flops 102a-102n may be implemented as D-flip-flops, T-flip-flops, or other flip-flops to meet the design criteria of a particular implementation.

The flip-flops 102a-102n may be configured in a shift register configuration. In general, each of the flip-flops 102a-102n has one of a number of inputs 106a-106n that receives a signal (e.g., CLOCK). The signal CLOCK may be a periodic clock signal that has a particular frequency of oscillation. Each of the flip-flops 102a-102n also has one or a number of data inputs 108a-108n and one of a number of outputs 110a-110n (e.g., the flip-flop 108a has an input 106a, an input 108a and an output 110a). The data input (e.g., 108b) of each of the flip-flops (e.g., 102b) is normally connected to an output (e.g., 110a) of a previous one of the flip-flops (e.g., 102a). In general, the flip-flops 102a-102n do not use a feedback of the signal CLOCK.

The first flip-flop 102a normally receives a feedback of the output 110a of the first flip-flop 102a. The feedback is normally inverted through an inverter 112. The outputs 110a-110n of each of the flip-flops 102a-102n are normally presented to a number of inputs 114a-114n of the compare circuit 104. After a specified maximum number of clock cycles, the flip-flops 102a-102n normally achieve a known state. The compare circuit 104 compares the state of the signals presented at each of the outputs 110a-110n to a known state (or pattern). If all of the flip-flops 102a-102n have not yet achieved the known state, the compare circuit 104 will assert a signal (e.g., RESET). The signal RESET will remain asserted until the outputs 110a-110n of the flip-flops 102a-102n reach the known state. Settling into the known state of the flip-flops normally indicates a characteristic of a stable system.

The flip-flops 102a-102n may be implemented as a shift register, with the leading flip-flop 102a toggling each clock cycle. The toggling of the flip-flop 102a will propagate through the chain of flip-flops 102a-102n. When power is first applied to the circuit 100, the flip-flops 102a-102n will have a random distribution of 1s and 0s presented to the respective data inputs 108a-108n. Since the pattern stored in the flip-flops 102a-102n is very unlikely to match the two known patterns in the compare circuit 104 (e.g., 0x5555555555 and 0XAAAAAAAAAA), the signal RESET will initially be asserted. After a number of clock cycles (between 1 and 40 depending on the initial power-up pattern), the flip-flops 102a-102n will contain an alternating pattern of 1s and 0s. Until the alternate pattern matches 0x5555555555 or 0xAAAAAAAAAA each clock cycle, the signal RESET will remain asserted.

The circuit 100 relies on the probability being extremely low that the steady-state pattern is achieved when power is first applied to the circuit. Given a random distribution of 1s and 0s, the likelihood is only 2 in $2^{40}$ (in the example when 40 flip-flops 102a-102n are implemented), or one in half a trillion chance that a steady state is achieved immediately upon the application of power and resulting in the signal RESET not being asserted. The circuit employs checking for a pattern of both 1s and 0s (as opposed to all 1s or all 0s) so that if the semiconductor characteristics favor a flip-flop value of 1 or 0 when power is first applied, the steady-state patterns will not be achieved.

The length of the signal RESET may be varied to meet the design criteria of a particular implementation. The length of the signal RESET normally depends on the initial power-up pattern. However, the maximum length (or pulse) of the signal RESET is normally 40 (for the example when the number of flip-flops 102a-102n implemented is 40).

The length of the shift register may be adjusted to meet the design criteria of a particular implementation by adding or subtracting the number of the flip-flops 102a-102n. Having a longer shift register chain lessens the probability that the steady-state pattern would be achieved upon power-up. Having a longer shift register chain also lengthens (on average) the time the signal RESET is asserted. Having a shorter shift register chain shortens the average time the signal RESET is asserted. A shorter shift register chain also uses less logic, but has a higher probability that the steady-state pattern would be achieved upon power-up.

The digital POR circuit 100 will normally assert the signal RESET from the onset of power being applied, until enough clock cycles have been received to achieve a steady-state condition. In the steady-state condition, the circuit 100 does not assert the signal RESET. The particular number of flip-flops 102a-102n normally determines the chance that the circuit 100 will be in the steady-state condition at the onset of power being applied. The larger the number of flip-flops 102a-102n, the less chance of a random steady state condition on power up.

The greater the number of flip-flops 102a-102n, the longer the signal RESET will be asserted. A shorter assertion of the signal RESET may be useful for systems in which a shorter time from power-on to functional operation is important. In such a case, the chain of flip-flops 102a-102n may be split into a number of shorter chains (to be described in more detail in connection with FIGS. 2 and 5).

Figure 2:
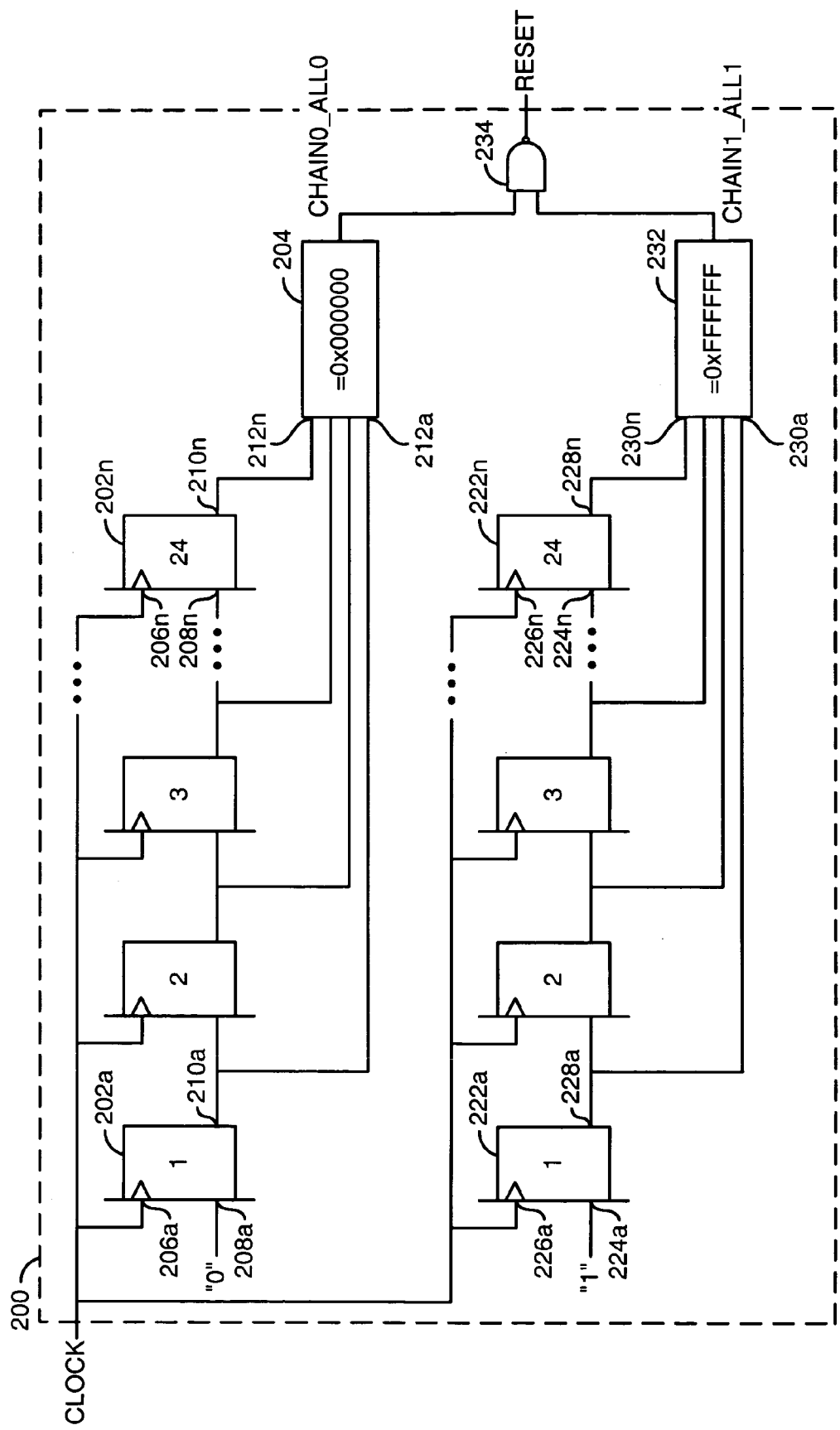
FIG. 2 is a block diagram of an alternate embodiment of the present invention.

Referring to FIG. 2, a circuit 200 implementing a multiple shift register chain embodiment is shown. The circuit 200 generally comprises a set of flip-flops 202a-202n, a compare circuit 204, a set of flip-flops 222a-222n, and a compare circuit 232. The flip-flops 202a-202n may implement a scan chain. Each of the flip-flops 202a-202n has one of a number of clock inputs 206a-206n that receives the clock signal CLOCK, one of a number of inputs 208a-208n that receives a data signal, and one of a number of outputs 210a-210n that presents an output. Each of the outputs 210a-210n is presented to one of a number of inputs 212a-212n of the compare circuit 204. The data input 208a of the flip-flop 202a may receive a digital "1" (or a digital "0").

Another shift register chain may be implemented with the flip-flops 222a-222n. Similar to the circuit 100 of FIG. 1, each of the flip-flops 222a-222n has one of a number of data inputs 224a-224n, one of a number of clock inputs 226a-226n and one of a number of outputs 228a-228n. Signals from each of the outputs 228a-228n are presented to a number of inputs 230a-230n of the compare circuit 230. The data input 224a of the flip-flop 222a may receive a digital "1" (or a digital "0").

The compare circuit 204 may present a signal (e.g., CHAIN0_ALL0) in response to each of the signals received at the inputs 212a-212n being equal to the predetermined value stored in the compare circuit 204. The compare circuit 232 may present a signal (e.g., CHAIN0_ALL1) in response to each of the signals received at the inputs 230a-230n being equal to the predetermined value stored in the compare circuit 232. The gate 234 presents the signal RESET in response to the signals CHAIN0_ALL0 and CHAIN1_ALL1 from the compare circuit 204 and the compare circuit 232.

In general, the circuit 200 implements multiple shift register chains. Each of the chains is shown having 24 flip-flops. However, the particular number of chains may be varied (e.g., increased or decreased) to meet the design criteria of a particular implementation. The multiple chains normally allow the use of a large number of flip-flops 202a-202n and 222a-222n. Increasing the number of flip-flops decreases the probability that the steady-state pattern would be achieved upon power-up. However, a balance is normally used in selecting the number of flip-flops 222a-222n. Since fewer flip-flops 202a-202n and 222a-222n may achieve steady-state in fewer clock cycles.

The steady-state pattern that is achieved may be adjusted. The particular predetermined pattern may be modified in a number of ways. For example, logic may be placed within the shift register chains 202a-202n and 222a-222n. In another example, separate chains may be implemented with different steady-state patterns in each chain.

The following TABLE 1 illustrates the operation of the circuit 200:

TABLE 1

|  | "0" chain | "1" chain |
|---|---|---|
| initial | 10011000011101100101010100 | 01000101011001111000101001 |
| cycle 1 | 01001100001110110010101010 | 10100010101100111110001100 |
| cycle 2 | 00100110000111011001010101 | 11010001010110011110000110 |
| cycle 3 | 00010011000011101100101010 | 11101000101011001111100001 |
| cycle 4 | 00001001100001110110010101 | 11110100010101100111110000 |
| cycle 5 | 00000100110000111011001010 | 11111010001010110011111000 |
| cycle 6 | 00000010011000011101100101 | 11111101000101011001111100 |
| cycle 7 | 00000001001100001110110010 | 11111110100010101100111110 |
| cycle 8 | 00000000100110000111011001 | 11111111010001010110011111 |
| cycle 9 | 00000000010011000011101101 | 11111111101000101011001111 |
| cycle 10 | 00000000001001100001110110 | 11111111110100010101100111 |
| cycle 11 | 00000000000100110000111011 | 11111111111010001010110011 |
| cycle 12 | 00000000000010011000011101 | 11111111111101000101011001 |
| cycle 13 | 00000000000001001100001110 | 11111111111110100010101100 |
| cycle 14 | 00000000000000100110000111 | 11111111111111010001010110 |
| cycle 15 | 00000000000000010011000011 | 11111111111111101000101011 |
| cycle 16 | 00000000000000001001100001 | 11111111111111110100010101 |
| cycle 17 | 00000000000000000100110000 | 11111111111111111010001010 |
| cycle 18 | 00000000000000000010011000 | 11111111111111111101000101 |
| cycle 19 | 00000000000000000001001100 | 11111111111111111110100010 |
| cycle 20 | 00000000000000000000100110 | 11111111111111111111010001 |
| cycle 21 | 00000000000000000000010011 | 11111111111111111111101000 |
| cycle 22 | 00000000000000000000001001 | 11111111111111111111110100 |
| cycle 23 | 00000000000000000000000100 | 11111111111111111111111010 |
| cycle 24 | 00000000000000000000000010 | 11111111111111111111111101 |

After a variable number of clock cycles, which depends on the initial power-up conditions of the flip-flops, the steady state condition of the circuit 200 is achieved. In the example shown, 24 cycles are needed to achieve the steady state condition. With different initial conditions, the circuit 200 may settle to the steady-state in a different number of cycles. In the following TABLE 2, 16 cycles are needed to achieve the steady state condition:

TABLE 2

| | | |
|---|---|---|
| initial | 0000000000011001010100 | 1111111011001110001001 |
| cycle 1 | 0000000000001100101010 | 1111111101100111100100 |
| cycle 2 | 0000000000000110010101 | 1111111110110011100010 |
| cycle 3 | 0000000000000011001010 | 1111111111011001110001 |
| cycle 4 | 0000000000000001100101 | 1111111111101100111000 |
| cycle 5 | 0000000000000000110010 | 1111111111110110011100 |
| cycle 6 | 0000000000000000011001 | 1111111111111011001110 |
| cycle 7 | 0000000000000000001100 | 1111111111111101001111 |
| cycle 8 | 0000000000000000000110 | 1111111111111110100111 |
| cycle 9 | 0000000000000000000011 | 1111111111111111010011 |
| cycle 10 | 0000000000000000000001 | 1111111111111111011001 |
| cycle 11 | 0000000000000000000000 | 1111111111111111101100 |
| cycle 12 | 0000000000000000000000 | 1111111111111111110110 |
| cycle 13 | 0000000000000000000000 | 1111111111111111111011 |
| cycle 14 | 0000000000000000000000 | 1111111111111111111101 |
| cycle 15 | 0000000000000000000000 | 1111111111111111111110 |
| cycle 16 | 0000000000000000000000 | 1111111111111111111111 |

Figure 3:
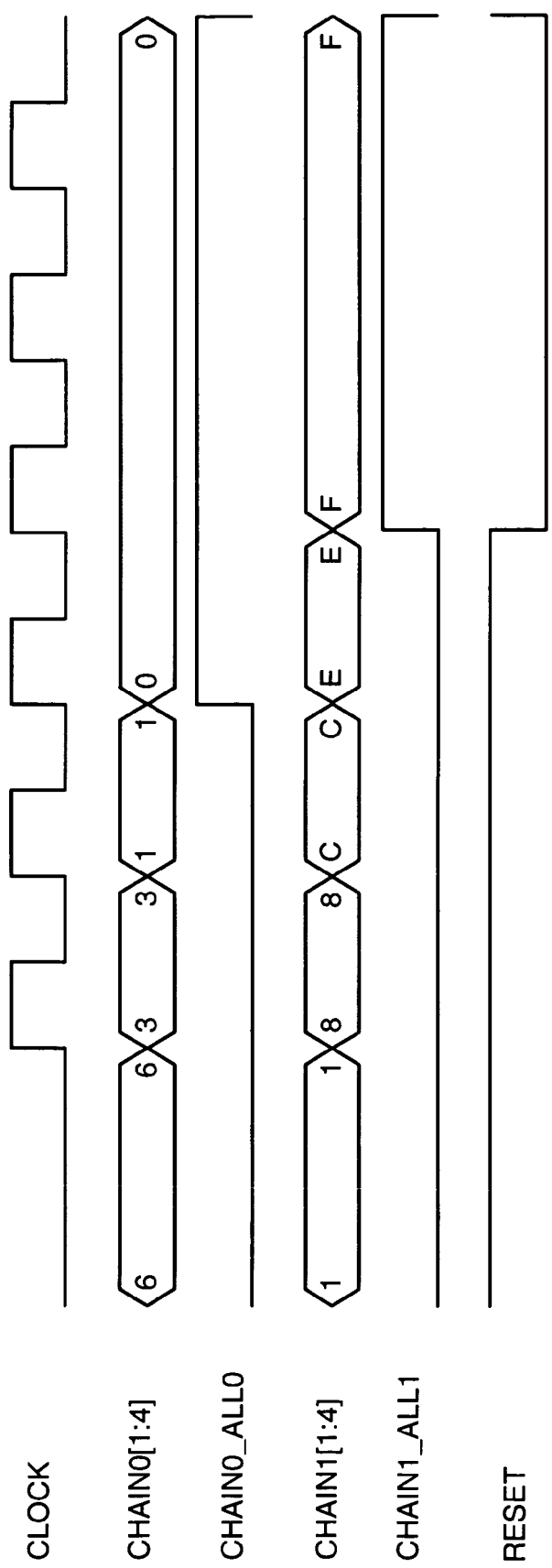
FIG. 3 is a timing diagram illustrating various signals from FIG. 2.

Referring to FIG. 3, a timing diagram of an example of the present invention with a 4 flip-flop implementation is shown. The timing diagram shows the signal CLOCK, a signal CHAIN0[1:4], the signal CHAIN0_ALL0, a signal CHAIN1 [1:4], the signal CHAIN1_ALL1, and the signal RESET. The signal CHAIN0[1:4] illustrates a 4-bit signal presented to the inputs 212a-212n. The signal CHAIN1[1:4] represents 4 bits presented to the inputs 230a-230n. Once the signal CHAIN0 [1:4] settles, the signal CHAIN_ALL0 transitions from a low to a high. Once the signal CHAIN1[1:4] settles, the signal CHAIN1_ALL1 transitions from a low to a high. Once both the signals CHAIN0_ALL0 and the signal CHAIN1_ALL1 are both transitioned high, the signal RESET transitions from a high to a low.

Figure 4:
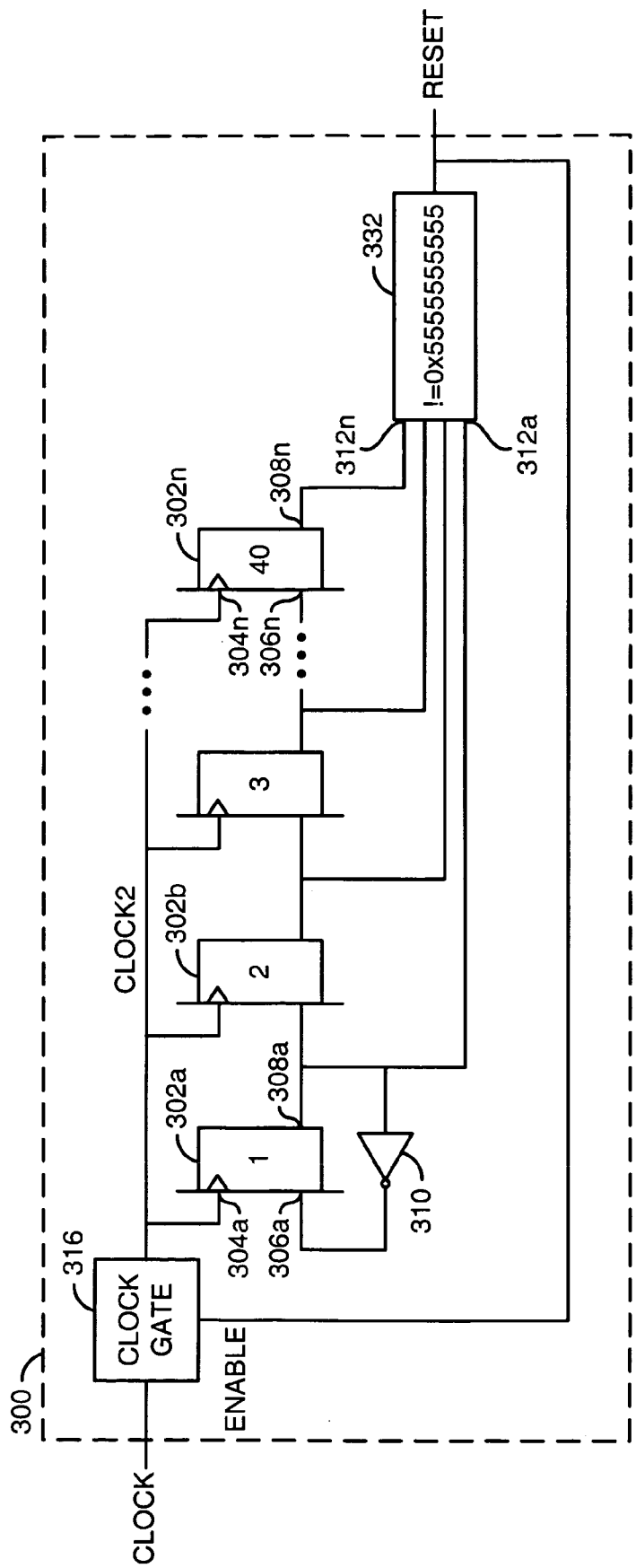
FIG. 4 is an alternate embodiment of the present invention.

Referring to FIG. 4, a circuit 300 is shown implementing an alternate embodiment of the present invention. The circuit 300 generally comprises a plurality of flip-flops 302a-302n, a clock gate block (or circuit) 316 and a compare block (or circuit) 332. The clock signal CLOCK is first presented to the clock gate circuit 316. A feedback of the signal RESET may be presented to an enable input of the clock gate circuit. The gate circuit 316 then generates a gated clock signal (e.g., CLOCK1) when the enable signal is present.

Each of the flip-flops 302a-302n has one of a number of inputs 304a-304n that receive the gated clock signal CLOCK1, one of a number of data inputs 306a-306n and one of a number of outputs 308a-308n. Similar to the circuit 100 of FIG. 1, the output 308a is normally presented as a feedback, through an inverter 310, back to the input 306a. Each of the outputs 308a-308n are normally presented to a number of inputs 312a-312n of the circuit 332. While a number of flip-flops 302a-302n is shown as 40, the particular number of flip-flops may be adjusted (e.g., either increased or decreased) to meet the design criteria of a particular implementation. The clock gate circuit normally only presents the signal CLOCK to the flip-flops 302a-302n when the enable input is active.

Gating the flip-flops 302a-302n of shift register when the steady-state pattern is achieved saves power. The flip-flops 302a-302n are normally clocked while the signal RESET is asserted. When the steady-state pattern is detected, the signal RESET is deasserted and the flip-flops are no longer clocked.

Figure 5:
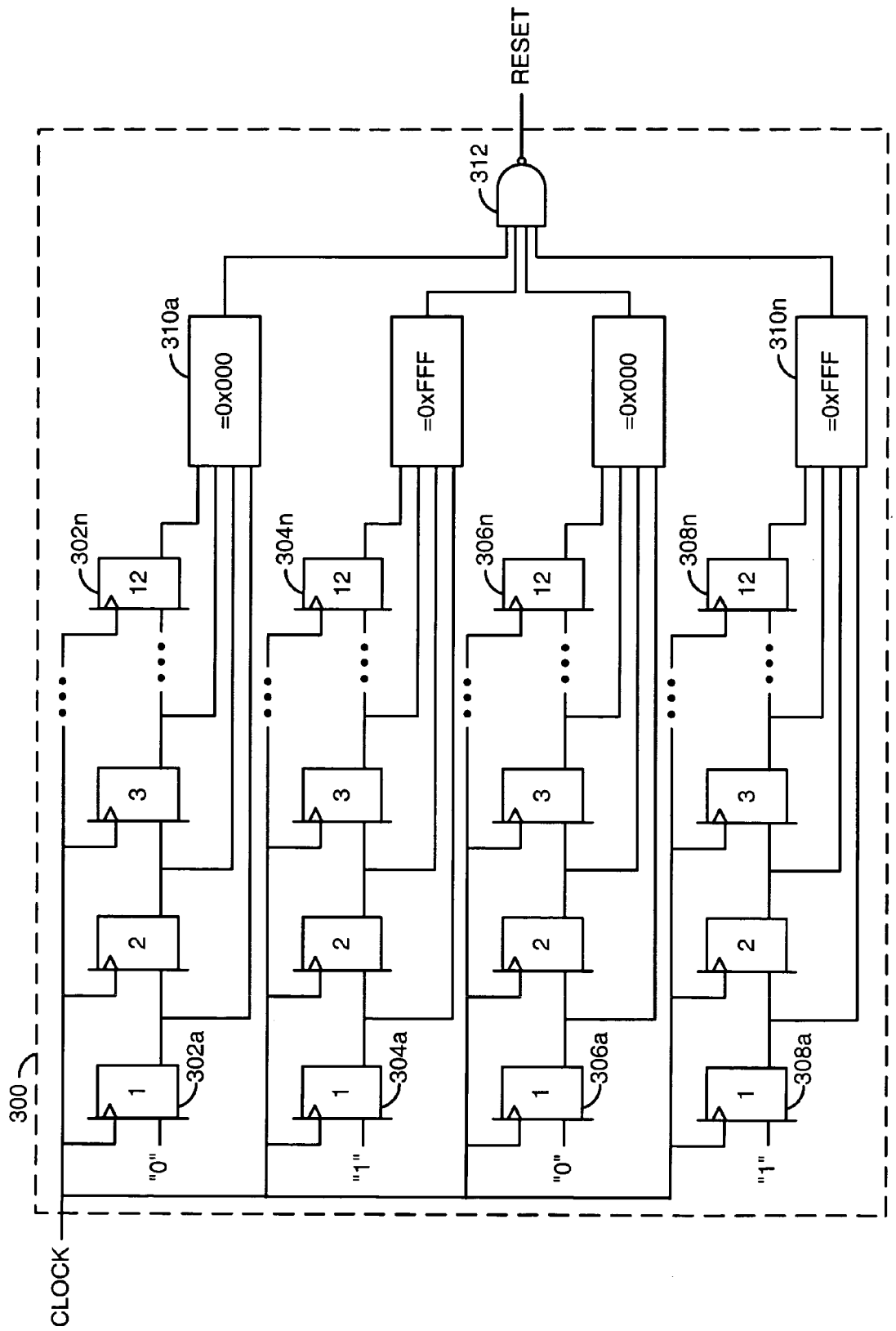
FIG. 5 is an alternate embodiment of the present invention.

Referring to FIG. 5, a circuit 300 is shown implementing an alternate implementation of the present invention. The circuit 300 generally comprises a shift chain comprising a number of flip-flops 302a-302n, a shift chain comprising a number of flip-flops 304a-304n, a shift chain comprising a number of flip-flops 306a-306n, a shift chain comprising a number of flip-flops 308a-308n, a number of comparators 310a-310n and a gate 312. The gate 312 is shown as a NAND gate. However, other gates may be implemented to meet the design criteria of a particular implementation. In the example shown, four shift chains are implemented. By breaking up the number of shift chains, the overall time needed to achieve the steady state may be minimized.

The following TABLE 3 shows the operation of the alternate implementation of the circuit 300:

TABLE 3

| | 1st "0" chain | 2nd "0" chain | 1st "1" chain | 2nd "1" chain |
|---|---|---|---|---|
| initial | 100110000111 | 011001010100 | 000101010110 | 111110001001 |
| cycle 1 | 010011000011 | 001100101010 | 100010101011 | 111111000100 |
| cycle 2 | 001001100001 | 000110010101 | 110001010101 | 111111100010 |
| cycle 3 | 000100110000 | 000011001010 | 111000101010 | 111111110001 |
| cycle 4 | 000010011000 | 000001100101 | 111100010101 | 111111111000 |
| cycle 5 | 000001001100 | 000000110010 | 111110001010 | 111111111100 |
| cycle 6 | 000000100110 | 000000011001 | 111111000101 | 111111111110 |
| cycle 7 | 000000010011 | 000000001100 | 111111100010 | 111111111111 |
| cycle 8 | 000000001001 | 000000000110 | 111111110001 | 111111111111 |
| cycle 9 | 000000000100 | 000000000011 | 111111111000 | 111111111111 |
| cycle 10 | 000000000010 | 000000000001 | 111111111100 | 111111111111 |
| cycle 11 | 000000000001 | 000000000000 | 111111111110 | 111111111111 |
| cycle 12 | 000000000000 | 000000000000 | 111111111111 | 111111111111 |

Again, after a number of clock cycles, which depends on the initial power-up conditions of the flip-flops 302a-302n, 304a-304n, 306a-306n, and 308a-308n, the steady state condition of the circuit 300 is achieved. Since the chains 302a-302n, 304a-304n, 306a-306n, and 308a-308n are shorter (e.g., shown as 124 flip-flop chains), the average time to achieve the steady state is shorter.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a plurality of flip-flops each configured to (i) receive a clock signal and an input signal and (ii) generate an output signal, wherein said flip-flops are configured in series such that said output signal of a first of said flip-flops is presented as said input signal to a second of said flip-flops; and
    a compare circuit configured to generate a reset signal in response to each of said output signals, wherein said reset signal is asserted until each of said output signals matches a set of predetermined values stored in said compare circuit.

2. The apparatus according to claim 1, wherein (i) said reset signal remains asserted until said apparatus achieves a characteristic of a stable system and (ii) said characteristic occurs when each of said set of predetermined values stored in said compare circuit matches a corresponding one of said output signals.

3. The apparatus according to claim 1, wherein said set of predetermined values comprises a steady-state pattern.

4. The apparatus according to claim 1, wherein said clock signal oscillates at a fixed frequency.

5. The apparatus according to claim 1, wherein a time that said reset signal remains asserted comprises a reset assertion time.

6. The apparatus according to claim 5, wherein said reset assertion time is variable as a function to the number of flip-flops implemented.

7. The apparatus according to claim 1, wherein said predetermined values comprise all zeros.

8. The apparatus according to claim 1, wherein said predetermined values comprise all ones.

9. The apparatus according to claim 1, wherein:

said plurality of flip-flops are divided into a first chain configured to generate a first set of said output signals and a second chain configured to generate a second set of said output signals; and said compare circuit comprises (i) a first portion configured to generate a first compare signal by comparing said first set of said output signals to a predetermined value comprising all zeros, a second portion configured to generate a second compare signal by comparing said second set of outputs to a second predetermined value comprising all ones, and (iii) a gate circuit configured to generate said reset signal when both said first compare signal and said second compare signal are asserted.

10. An apparatus comprising:

a gate circuit configured to present a gated clock signal in response to a clock signal and an enable signal;

a plurality of flip-flops each configured to (i) receive said gated clock signal and an input signal and (ii) generate an output signal, wherein said flip-flops are configured in series such that said output signal of a first of said flip-flops is presented as said input signal to a second of said flip-flops; and a compare circuit configured to generate a reset signal in response to each of said output signals, wherein (a) said reset signal is asserted if each of said output signals does not match a set of predetermined values stored in said compare circuit and (b) said reset signal is used as said enable signal for said gate circuit.

11. The apparatus according to claim 10, wherein said reset signal remains asserted until said apparatus achieves a characteristic of a stable system.

12. The apparatus according to claim 11, wherein said characteristic occurs when each of said set of predetermined values stored in said compare circuit matches a corresponding one of said output signals.

13. The apparatus according to claim 10, wherein said set of predetermined values comprises a steady-state pattern.

14. The apparatus according to claim 10, wherein said clock signal oscillates at a fixed frequency.

15. The apparatus according to claim 10, wherein a time that said reset signal remains asserted comprises a reset assertion time.

16. The apparatus according to claim 15, wherein said reset assertion time is variable as a function to the number of flip-flops implemented.

* * * * *